United States Patent
Hoque et al.

(10) Patent No.: US 10,546,715 B2
(45) Date of Patent: Jan. 28, 2020

(54) CHARGED PARTICLE BEAM DEVICE

(71) Applicant: Hitachi High-Technologies Corporation, Minato-ku, Tokyo (JP)

(72) Inventors: Shahedul Hoque, Tokyo (JP); Hajime Kawano, Tokyo (JP); Yoshinori Momonoi, Tokyo (JP); Hideki Itai, Tokyo (JP); Minoru Yamazaki, Tokyo (JP); Hiroshi Nishihama, Tokyo (JP)

(73) Assignee: Hitachi High—Technologies Corporation, Tokyo (JP)

( * ) Notice: Subject to any disclaimer, the term of this patent is extended or adjusted under 35 U.S.C. 154(b) by 0 days.

(21) Appl. No.: 15/761,294

(22) PCT Filed: Sep. 29, 2015

(86) PCT No.: PCT/JP2015/077412
§ 371 (c)(1),
(2) Date: Mar. 19, 2018

(87) PCT Pub. No.: WO2017/056171
PCT Pub. Date: Apr. 6, 2017

(65) Prior Publication Data
US 2018/0269026 A1    Sep. 20, 2018

(51) Int. Cl.
*H01J 37/147*    (2006.01)
*H01J 37/28*     (2006.01)
(Continued)

(52) U.S. Cl.
CPC .......... *H01J 37/147* (2013.01); *G02B 21/002* (2013.01); *H01J 37/263* (2013.01); *H01J 37/28* (2013.01)

(58) Field of Classification Search
CPC ........ H01J 37/147; H01J 37/22; H01J 37/263; H01J 37/28; G02B 21/00
(Continued)

(56) References Cited

U.S. PATENT DOCUMENTS 4,691,103 A    9/1987 Le Poole et al.
5,737,006 A *  4/1998 Wong ................. G06K 15/1261
                                              347/235
(Continued)

FOREIGN PATENT DOCUMENTS

JP    59-75765 A    4/1984
JP    61-39442 A    2/1986
(Continued)

OTHER PUBLICATIONS

International Search Report (PCT/ISA/210) issued in PCT Application No. PCT/JP2015/077412 dated Jan. 26, 2016 with English-language translation (five (5) pages).
(Continued)

*Primary Examiner* — Nicole M Ippolito
(74) *Attorney, Agent, or Firm* — Crowell & Moring LLP

(57) ABSTRACT

The objective of the present invention is to provide a charged particle beam device wherein scanning is performed through a scanning pattern that may suppress the influence from charge accumulation without having to perform blanking. In order to achieve this objective, a charged particle beam device is proposed wherein a first scan line is scanned by deflecting a charged particle beam in a first direction. The charged particle beam is deflected in a manner where the ending point of the first scan line is connected to the scan starting point of a second scan line which is arranged to be parallel to the first scan line so as to draw a scanning trajectory, thereby modifying the scan line position. The second scan line is scanned by scanning the charged particle beam from the scan starting point of the second scan line toward a second direction that is opposite to the first direction. After scanning the second scan line, the charged particle beam device scans the interior of a first frame by repeating the scan line position modification and the scanning of the charged particle beam toward the opposite
(Continued)

direction. After scanning the first frame, the charged particle beam device starts the scanning of a second frame with the scan ending point contained within the first frame serving as the scan starting point.

15 Claims, 13 Drawing Sheets

(51) Int. Cl.
*H01J 37/26* (2006.01)
*G02B 21/00* (2006.01)

(58) Field of Classification Search
USPC ......... 250/396 R, 397, 492.1, 492.2, 492.21, 250/492.22, 492.23
See application file for complete search history.

(56) References Cited

U.S. PATENT DOCUMENTS

| | | | |
|---|---|---|---|
| 6,300,628 B1 * | 10/2001 | Fujii | ............... H01J 37/3056 250/310 |
| 7,851,756 B2 | 12/2010 | Fukaya et al. | |
| 2004/0263607 A1 * | 12/2004 | Satoh | ................. B41J 2/442 347/235 |
| 2004/0263875 A1 * | 12/2004 | Okamoto | ................ B41J 3/54 358/1.8 |
| 2013/0254948 A1 | 9/2013 | Hartong et al. | |
| 2015/0094517 A1 * | 4/2015 | Prieels | ............. A61N 5/1048 600/1 |

FOREIGN PATENT DOCUMENTS

| | | |
|---|---|---|
| JP | 63-226868 A | 9/1988 |
| JP | 9-180667 A | 7/1997 |
| JP | 2004-271269 A | 9/2004 |
| JP | 5147327 B2 | 2/2013 |
| JP | 2013-89601 A | 5/2013 |
| JP | 2014-143075 A | 8/2015 |

OTHER PUBLICATIONS

Japanese-language Written Opinion (PCT/ISA/237) issued in PCT Application No. PCT/JP2015/077412 dated Jan. 26, 2016 (Eight (8) pages).

* cited by examiner

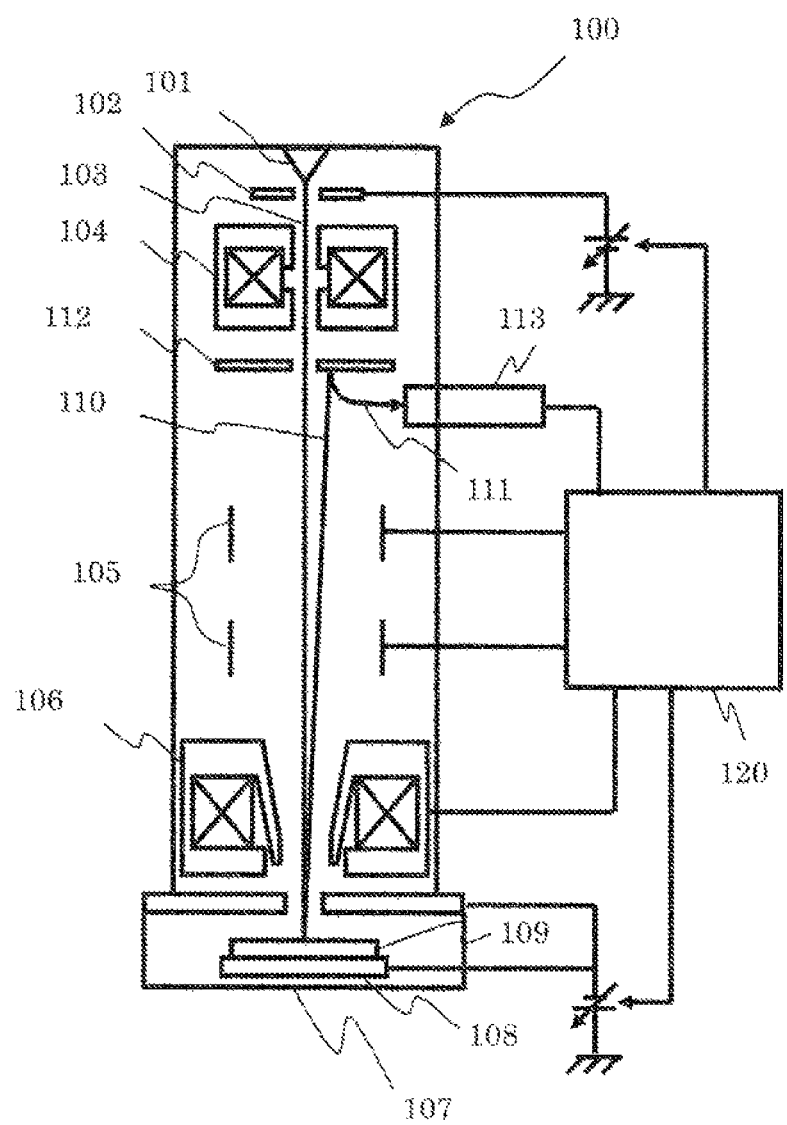
[Fig. 1]

[Fig. 2]
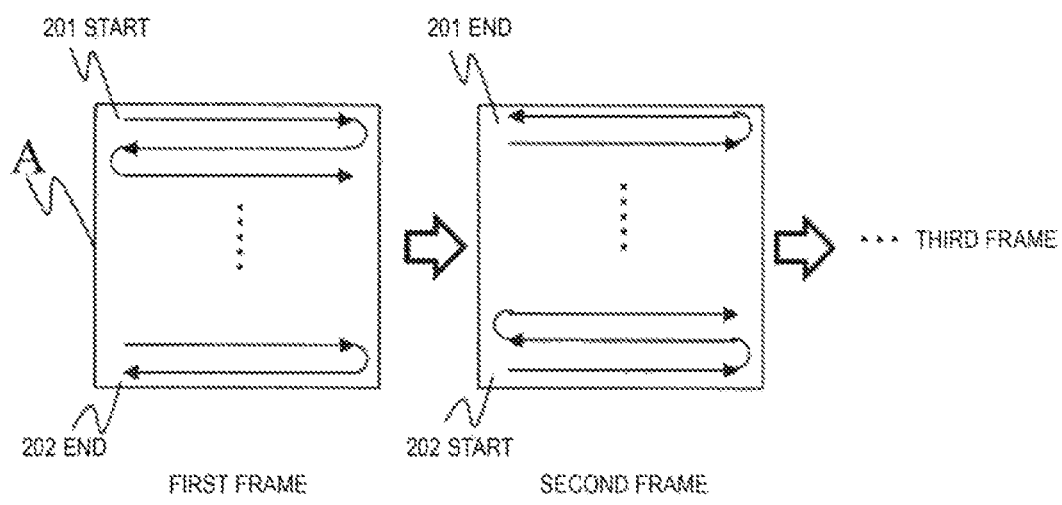

[Fig. 3]
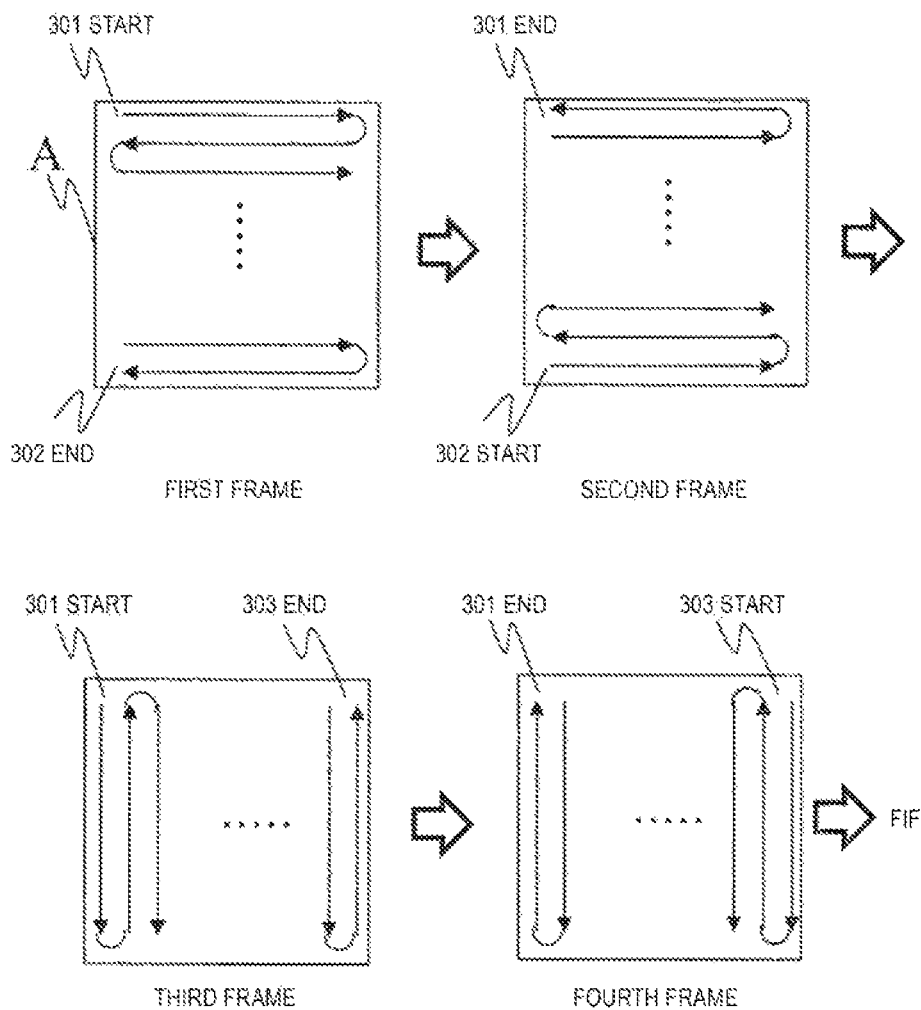

[Fig. 4]
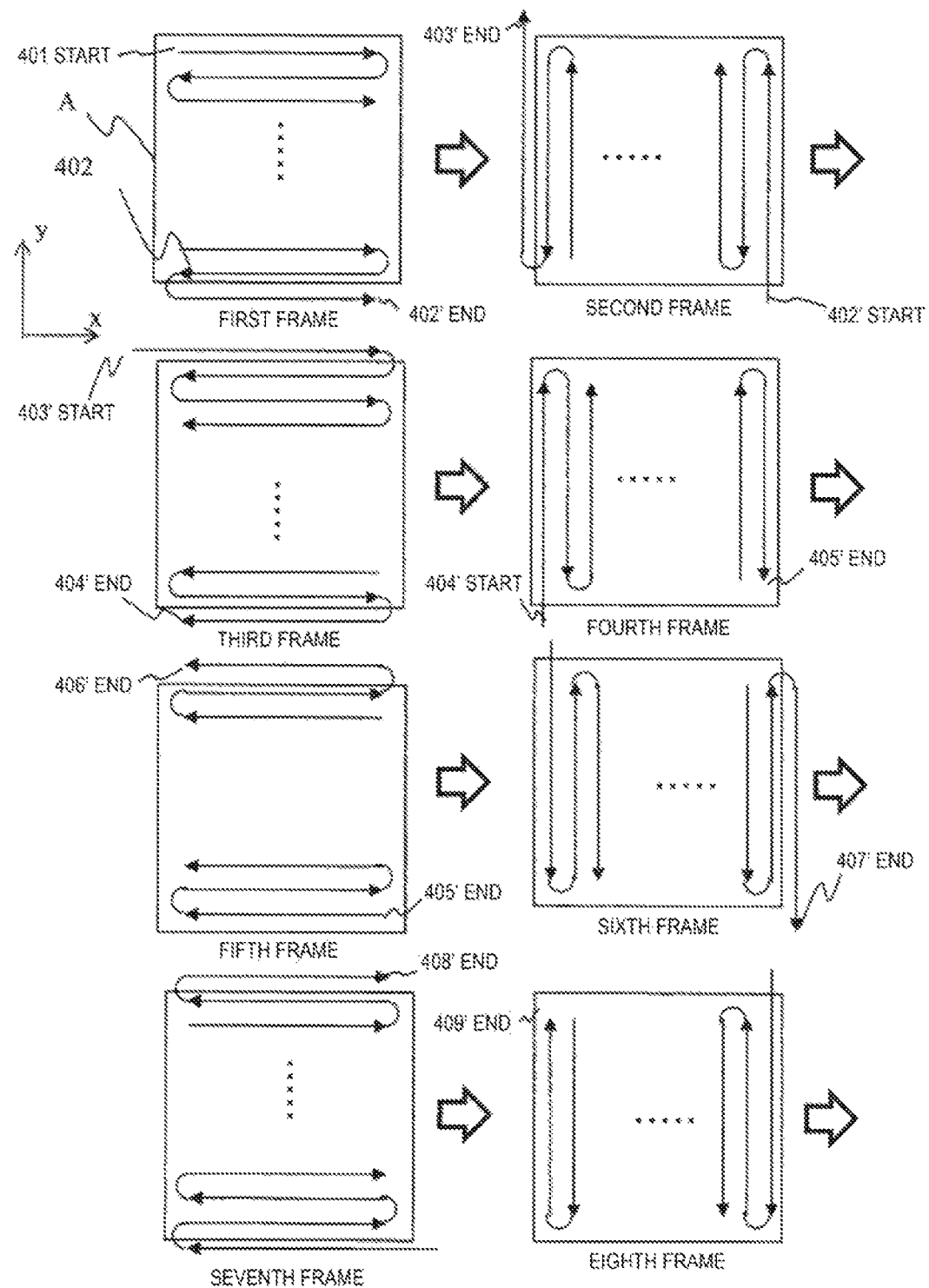

[Fig. 5]
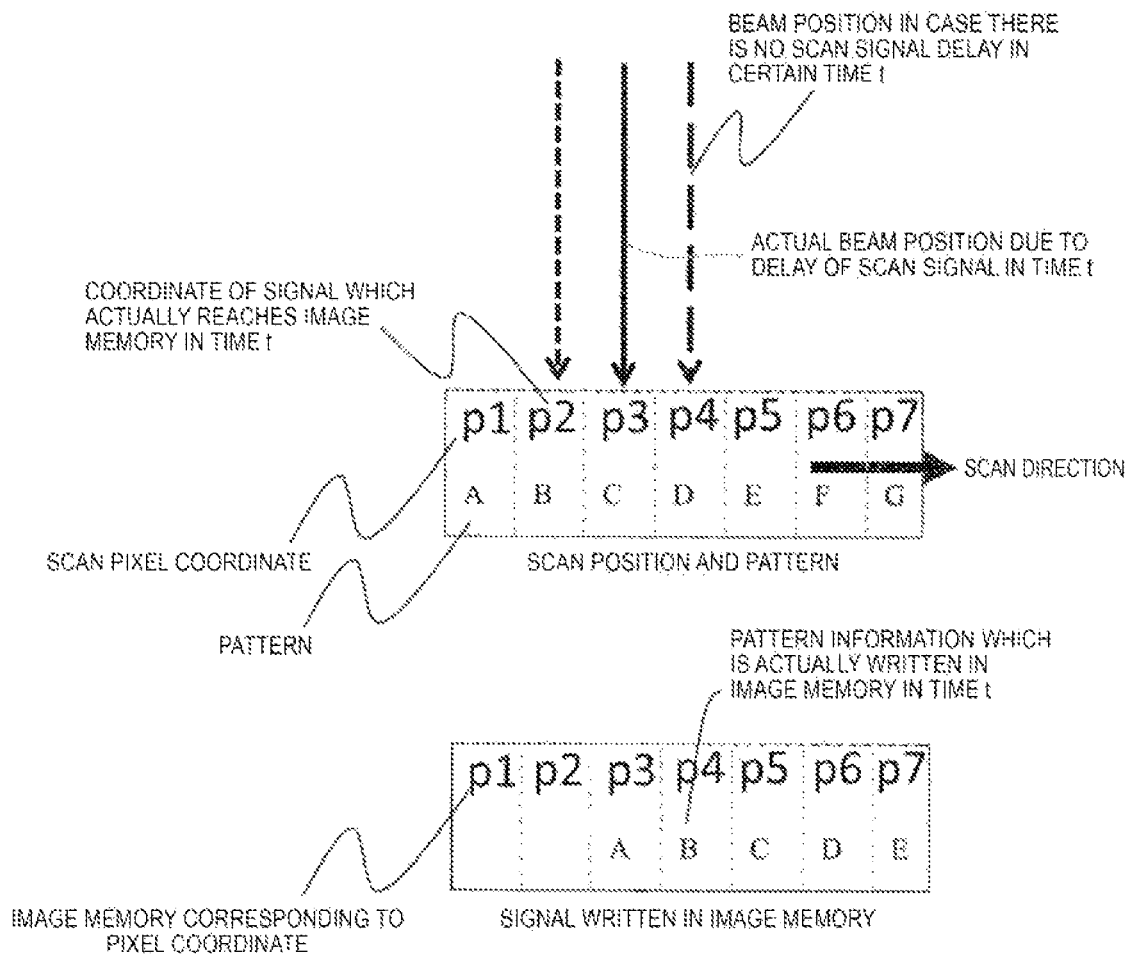
[Fig. 6]
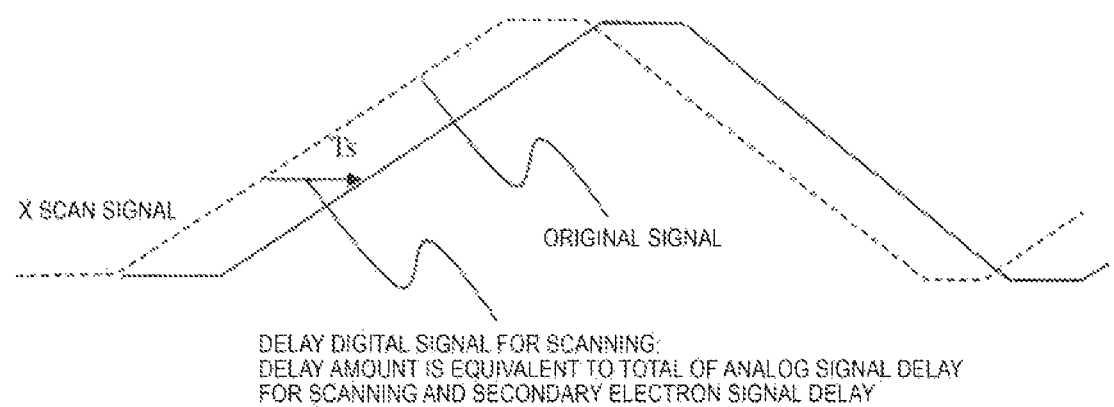

[Fig. 7]
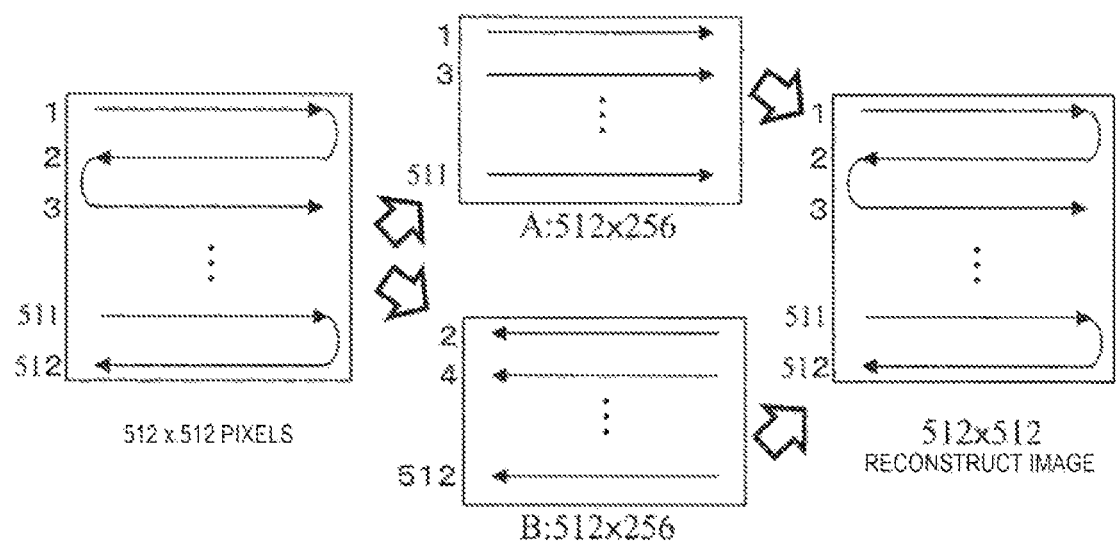

[Fig. 8]
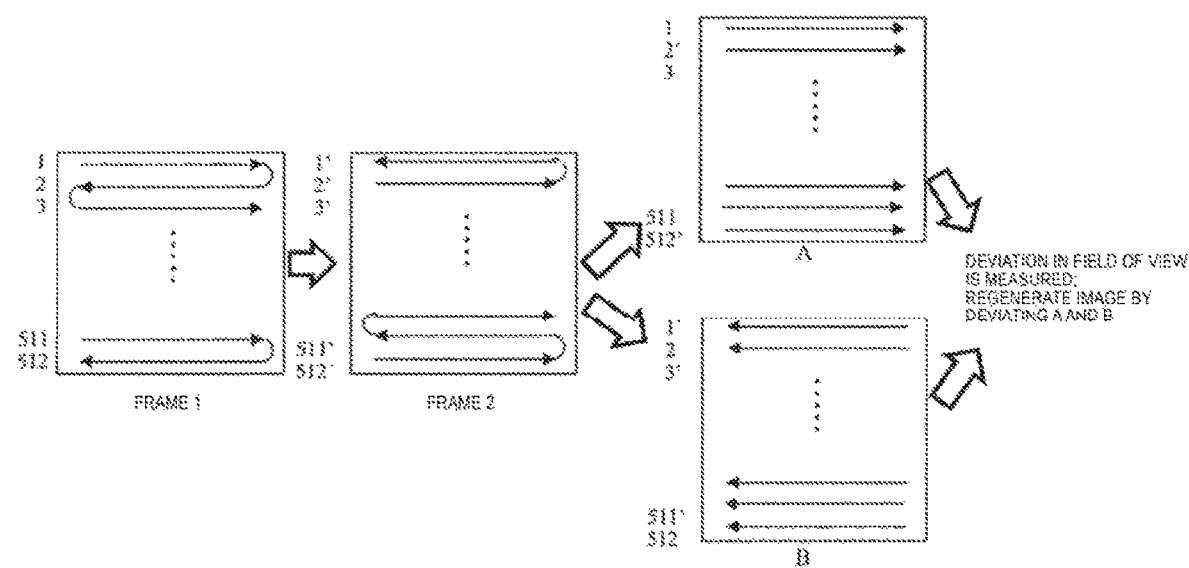

[Fig. 9A]
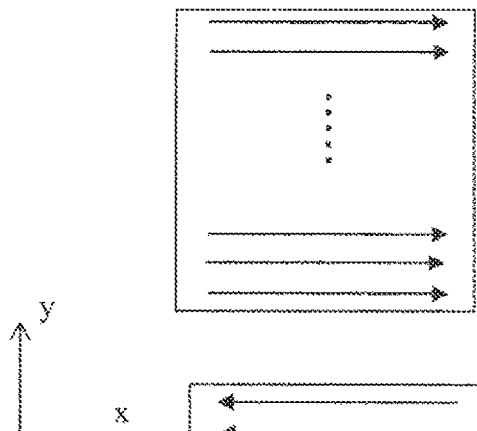
[Fig. 9B]
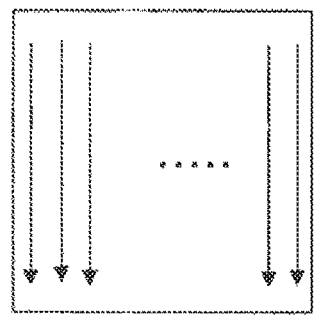
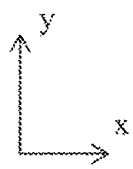
[Fig. 9C]
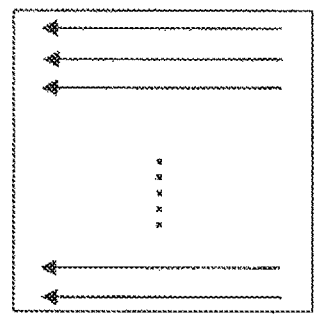
[Fig. 9D]
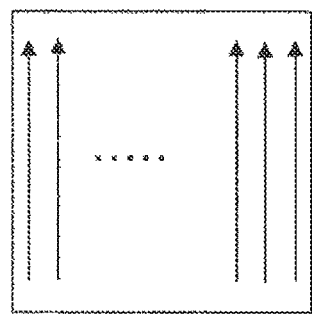
[Fig. 10]
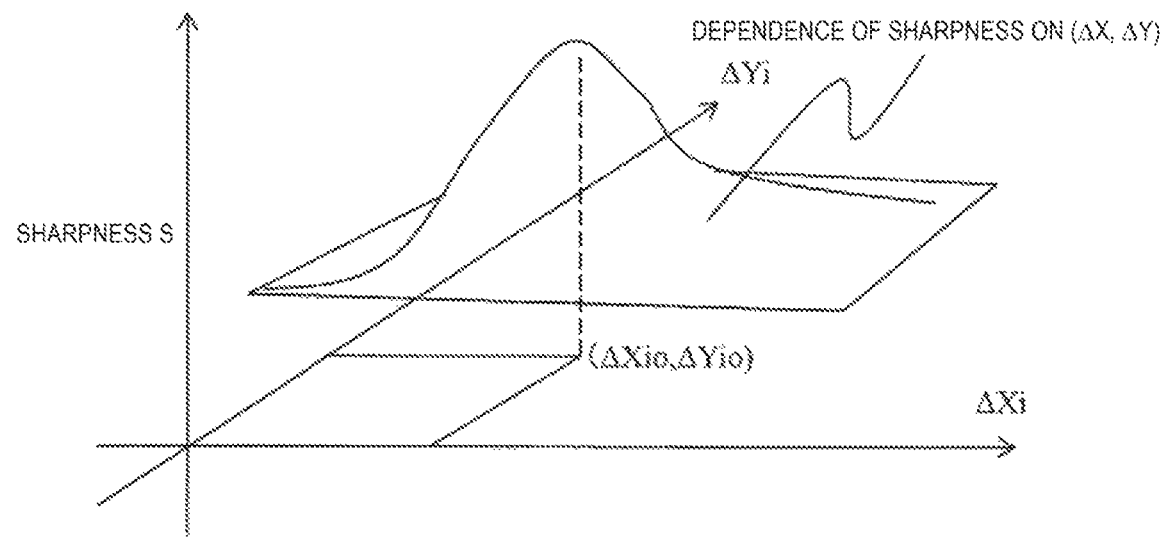

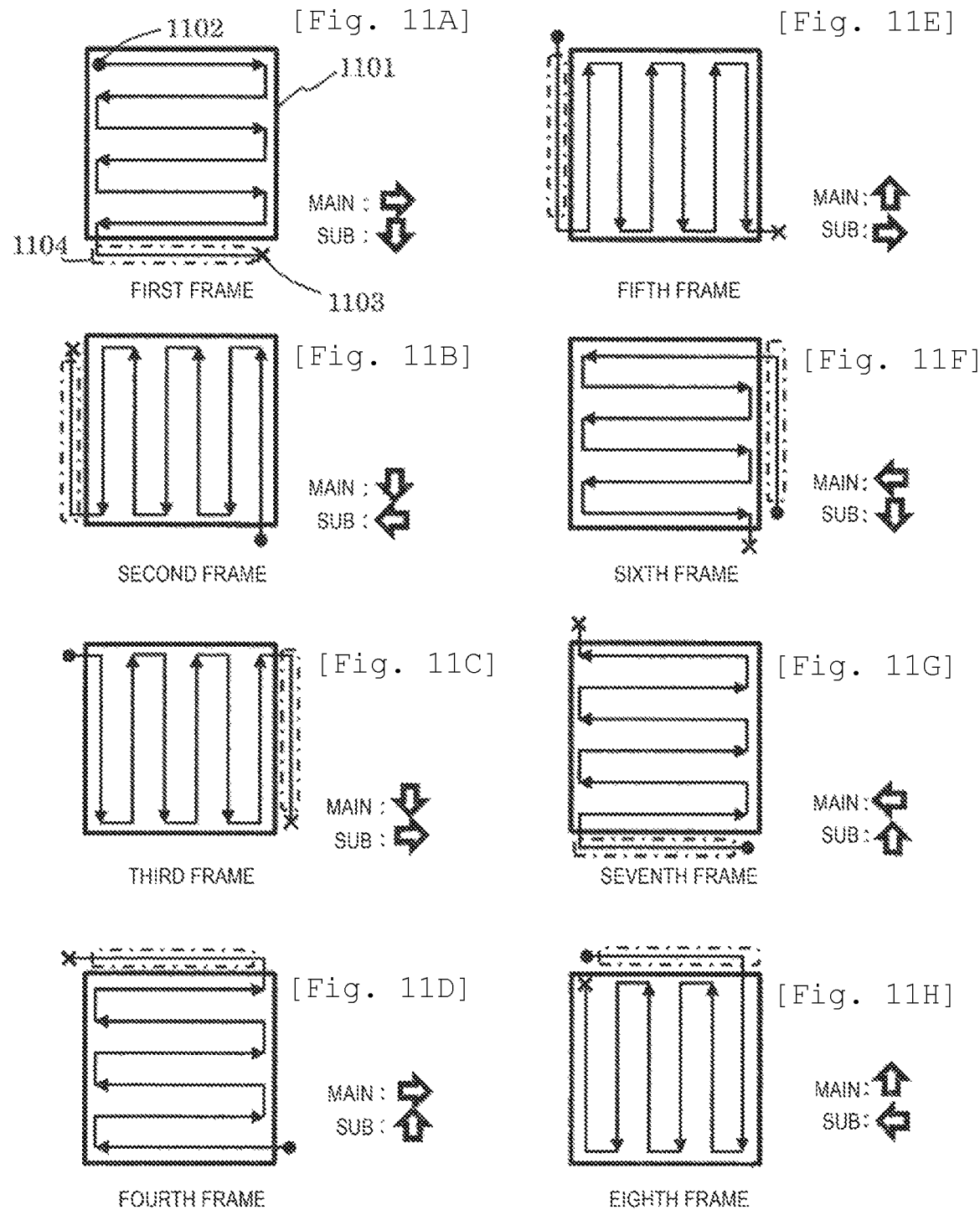

[Fig. 12A]
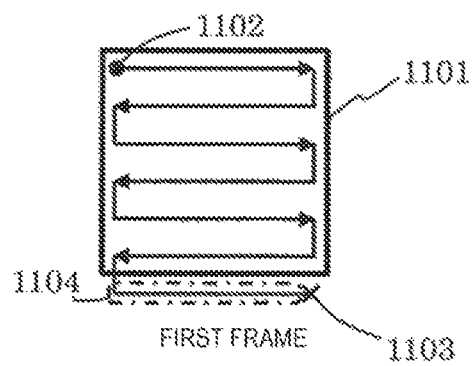
FIRST FRAME
[Fig. 12C]
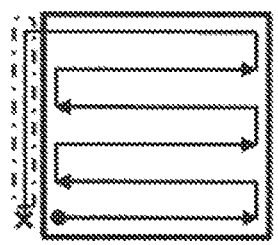
THIRD FRAME
[Fig. 12B]
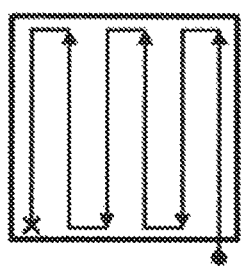
SECOND FRAME
[Fig. 12D]
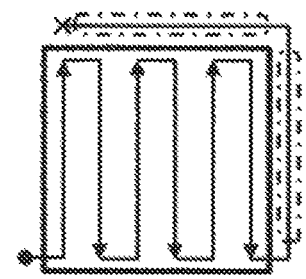
FOURTH FRAME

[Fig. 13A]
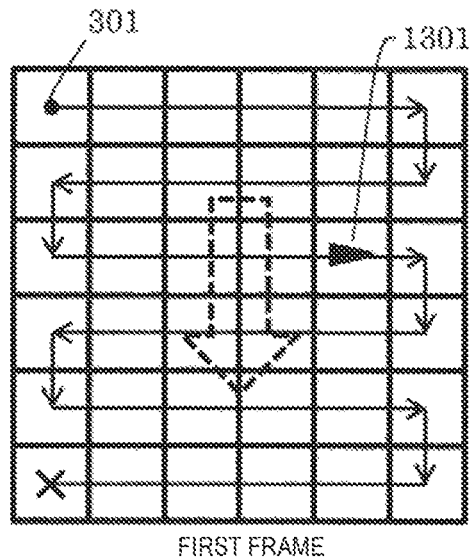
FIRST FRAME
[Fig. 13B]
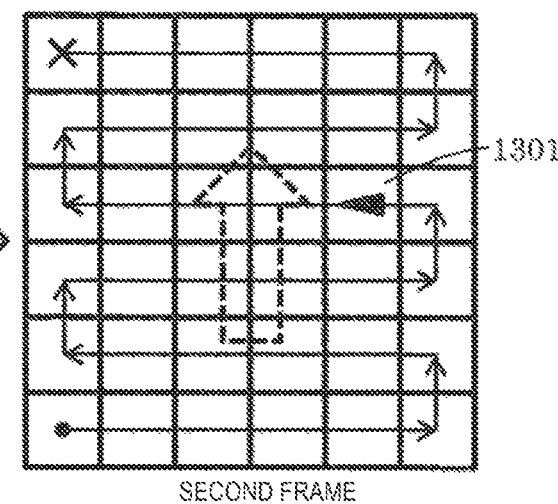
SECOND FRAME
[Fig. 13C]
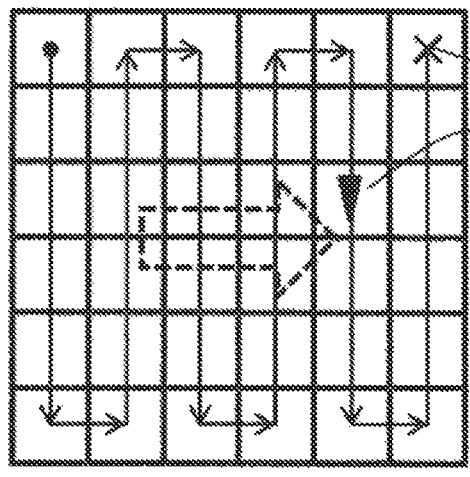
THIRD FRAME
[Fig. 13D]
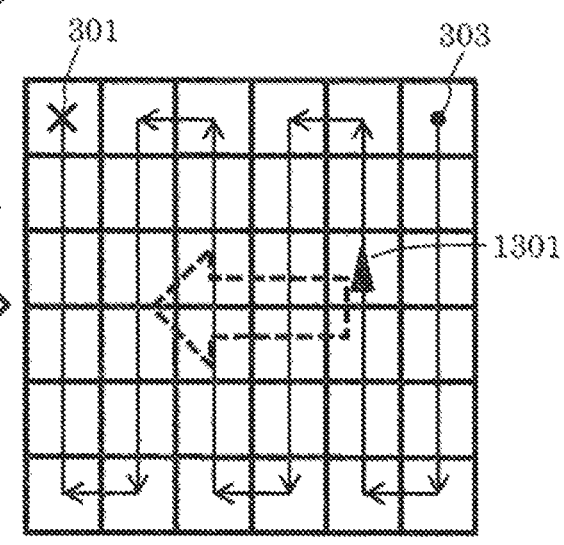
FOURTH FRAME

[Fig. 14A] [Fig. 14B]
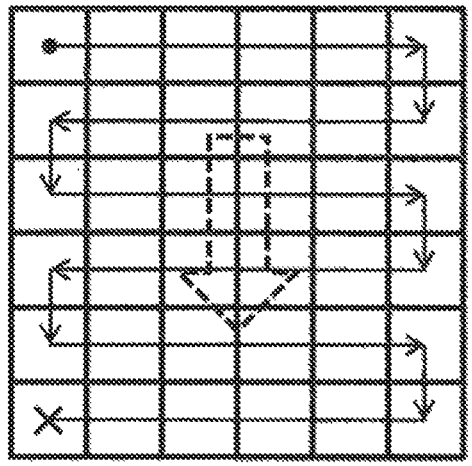 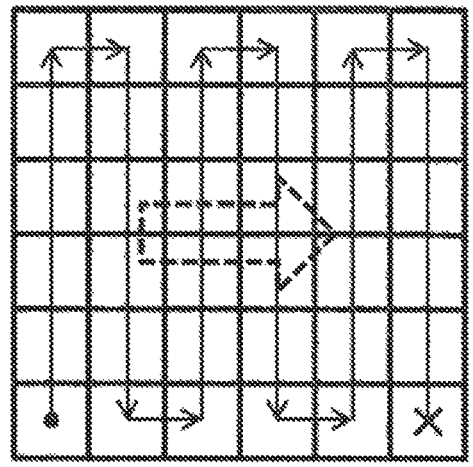
FIRST FRAME SECOND FRAME
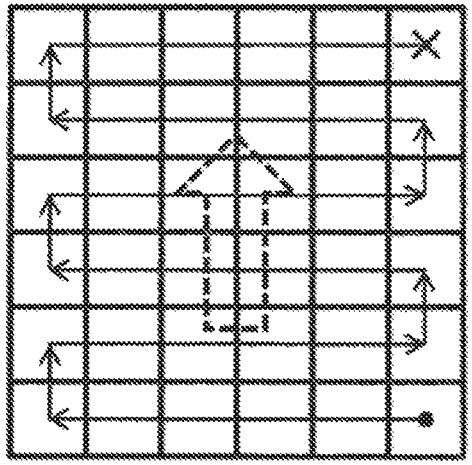  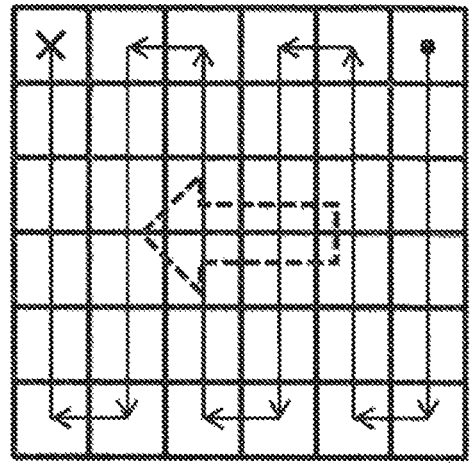
THIRD FRAME FOURTH FRAME
[Fig. 14C] [Fig. 14D]

[Fig. 15A]
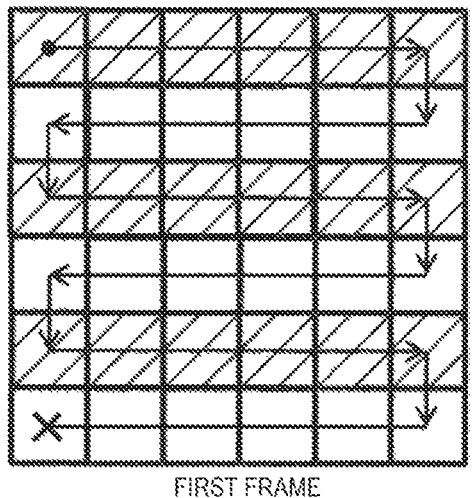
FIRST FRAME
[Fig. 15B]
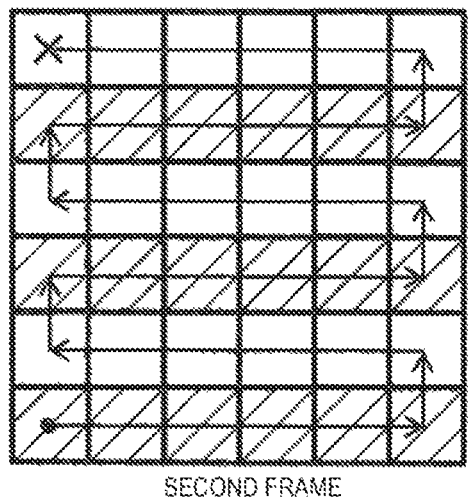
SECOND FRAME
[Fig. 15C]
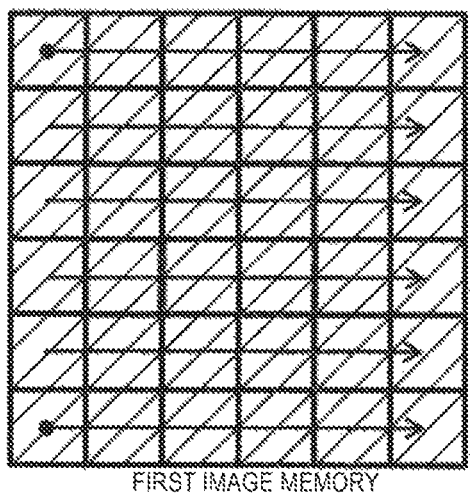
FIRST IMAGE MEMORY
(RIGHT SCAN IMAGE)
[Fig. 15D]
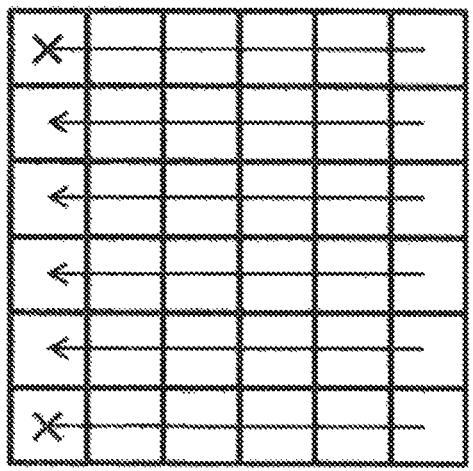
SECOND IMAGE MEMORY
(LEFT SCAN IMAGE)
MATCHING PROCESS
GENERATE COMBINED IMAGE

CHARGED PARTICLE BEAM DEVICE

TECHNICAL FIELD

The present invention relates to a charged particle beam device, and particularly, relates to a charged particle beam device capable of appropriately setting a beam scanning method.

BACKGROUND ART

As a semiconductor pattern becomes finer, a slight difference in a shape influences operation characteristics of a device, and thus, there is an increasing need for shape management. Thus, a scanning electron microscope (SEM) used in testing and measuring a semiconductor needs to have higher sensitivity and higher precision than those in the related art. In the SEM, when a sample is irradiated with an electron beam, secondary electrons emitted from the sample are detected, and thus, a shape of a surface is observed. In this case, the detected secondary electrons have low energy, and are easily influenced by electric charge on the sample. In recent years, since the pattern becomes finer and a material of low-dielectric constant such as low-k is used, the influence of the electric charge becomes apparent, and thus, it may be difficult to capture a signal of a location requiring management. Electric charge potential is distributed in an unevenness shape, and thus, a variation is caused in image contrast in the field of view (FOV). Thus, left, right, upper, and lower profiles may be asymmetric even though a pattern of which shapes of left and right edges or upper and lower edges are symmetric.

PTL 1 discloses a scanning method of inverting a direction in which a beam moves over scan lines in each of a plurality of frames and inverting an order in which a plurality of scan lines is scanned. PTL 2 describes a reciprocating scanning method of an electron beam. The reciprocating scanning is a scanning method of inverting a scan direction in an X-line direction for every scan line.

CITATION LIST

Patent Literature

PTL 1: Japanese Patent No. 5147327 (corresponding U.S. Pat. No. 7,851,756)
PTL 2: JP-A-2014-143075

SUMMARY OF INVENTION

Technical Problem

In a case where typical raster scanning is performed, it is possible to suppress beam irradiation performed onto the sample by performing blanking when a beam irradiation position between different frames is moved and a beam irradiation position between scan lines is moved. The blanking is a technology for blocking the beam irradiation performed onto the sample by deflecting the electron beam to a stop plate, and is to suppress the occurrence of the electric charge caused by the beam irradiation. The influence of the electric charge caused by the beam irradiation has been apparent as a semiconductor device is miniaturized. The blanking is an excellent method for eliminating the influence of the beam irradiation between the scan lines or between the frame, but it is apparent that the electric charge is also attracted due to the beam irradiation from a scan ending point of the scan line or the frame to a stop and the electric charge influences measurement precision using the electron microscope. PTL 1 and PTL 2 do not describe that the beam irradiation when the blanking is performed is suppressed.

Hereinafter, a charged particle beam device for performing scanning using a scanning pattern capable of suppressing the influence of electric charge without performing blanking will be suggested.

Solution to Problem

According to an aspect for achieving the above-described object, there is provided a charged particle beam device including: a scanning deflector that performs scanning with a charged particle beam emitted from a charged particle source; a detector that detects charged particles acquired based on the scanning with the charged particle beam; and a control device that controls the scanning deflector. The control device controls the scanning deflector to scan an area within a first frame in such a manner that a first scan line is scanned through deflection of the charged particle beam to a first direction, a second scan line is scanned by changing a scan line position through deflection of the charged particle beam such that a scanning trajectory which connects an ending point of the first scan line and a scan starting point of the second scan line located in parallel with the first scan line is drawn and performing the scanning with the charged particle beam toward a second direction opposite to the first direction from the scan starting point of the second scan line, and the changing of the scan line position and the scanning with the charged particle beam toward the opposite direction are repeatedly performed after the second scan line is scanned, and start to scan a second frame using a scan ending point included in the first frame as a scan starting point or start to scan the second frame after the scan position is changed such that a scanning trajectory which connects the scan ending point and a scan starting point of the second frame located in a different position is drawn after the first frame is scanned.

Advantageous Effects of Invention

With such a configuration, it is possible to perform scanning using a scanning pattern capable of suppressing the influence of electric charge without performing blanking.

BRIEF DESCRIPTION OF DRAWINGS

FIG. 1 is a diagram showing an outline of an electron microscope.

FIG. 2 is a diagram illustrating a scanning pattern that inverts a direction of reciprocating scanning in which a scan direction is changed for every line in every frame.

FIG. 3 is a diagram illustrating a scanning pattern that changes a direction of the reciprocating scanning in which the scan direction is changed for every line to four directions in every frame and scans the lines.

FIG. 4 is a diagram illustrating a scanning pattern when a beam deflection trajectory for changing a scan starting point out of a frame is provided and a plurality of frames is scanned.

FIG. 5 is a diagram showing the relationship between a scan coordinate and an image coordinate.

FIG. 6 is a diagram for describing a method of adjusting a scan signal.

FIG. 7 is a diagram for describing an example in which an image is formed by correcting a deviation between two images divided in the respective scan directions.

FIG. 8 is a diagram for describing an example in which an image is formed by correcting deviations between a plurality of images formed by extracting detection signals in the same scan direction from a plurality of frames.

FIGS. 9A to 9D are diagrams illustrating four scan line directions.

FIG. 10 is a diagram showing the relationship between sharpness and a deviation between the images when the images are accumulated by changing relative positions of the images.

FIGS. 11A to 11H are diagrams illustrating a scanning pattern that equalizes the scanning out of the FOV in upward, downward, leftward, and rightward directions of the FOV.

FIGS. 12A to 12D are diagrams illustrating the scanning pattern that equalizes the scanning out of the FOV in upward, downward, leftward, and rightward directions of the FOV.

FIGS. 13A to 13D are diagrams showing a scanning pattern that sequentially changes a sub-scan direction to the downward, upward, leftward, and rightward directions whenever the frame is changed.

FIGS. 14A to 14D are diagrams showing a scanning pattern that sequentially changes a sub-scan direction to the downward, upward, leftward, and rightward directions whenever the frame is changed.

FIGS. 15A to 15D are diagrams showing a process of generating a plurality of images in the respective scan line directions based on detection signals acquired by scanning a plurality of frames and combining the plurality of images.

DESCRIPTION OF EMBODIMENTS

Embodiments to be described below relate to a beam irradiation method capable of scanning a plurality of frames without performing blanking, and relate to a beam irradiation method of suppressing electric charge which is primarily caused by beam irradiation performed in an area out of the field of view. The blanking is performed in order to prevent an area in the field of view from being irradiated with a beam between scan lines and between scanning of a first frame and scanning of a next frame. Here, the electric charge caused by electron beam irradiation is attracted in a direction of the blanking (in a deflected direction of the electron beam), and the unevenness of electric charge asymmetric with respect to a center of the field of view occurs. The unevenness of the electric charge occurring due to the beam scanning in an area within the field of view is relaxed to some extent by rotating a scan direction for every frame, but it is insufficient in suppressing the influence of the electric charge for an image after the frames are accumulated. Due to the electric charge, the drift or the image blurring, the contrast unevenness and unevenness of pattern edge luminance occurs when imaging is performed, and thus it is difficult to detect a pattern. Thus, there is a possibility that measurement precision will be deteriorated.

Hereinafter, a charged particle beam device that suppresses the unevenness of electric charge by optimizing a scanning pattern of the beam will be described. In the embodiments to be described below, for example, there is provided a charged particle beam device including a scanning deflector that performs scanning with a charged particle beam emitted from a charged particle source, a detector that detects charged particles acquired based on the scanning with the charged particle beam, and a control device that controls a scan direction of the charged particle beam. The charged particle beam device images frames through continuous scanning in a blankingless manner, continuously performs all scanning processes including a frame accumulation process by continuously connecting the frames in the blankingless, and rotates the scan direction for every frame by 90° and 180°.

With the above-described configuration, since all the imaging processes are continuously performed in the blankingless, it is possible to minimize beam irradiation performed on a sample, and it is possible to reduce asymmetric electric charge and sample damage due to blanking. The electric charge is uniformly generated when the imaging is performed by rotating the scan direction for every frame. As a result, it is possible to reduce the drift and blurring of the image, the contrast unevenness and the asymmetry of the pattern edge within the field of view.

FIG. 1 is a diagram showing an outline of a scanning electron microscope (SEM) which is one type of a charged particle beam device. An electron beam 103 which is extracted from an electron source 101 by an extracting electrode 102 and is accelerated by an acceleration electrode (not shown) is narrowed by a condenser lens 104 which is one type of a focusing lens, and is one-dimensionally or two-dimensionally scanned on a sample 109 by a scanning deflector 105. The electron beam 103 is decelerated by a negative voltage applied to the electrode built in a sample stage 108, and is focused by a lens action of an objective lens 106. Thus, the sample 109 is irradiated with the electron beam.

If the sample 109 is irradiated with the electron beam 103, electrons 110 such as secondary electrons and backscattered electrons are emitted from the irradiation portion. The emitted electrons 110 are accelerated in an electron source direction by an acceleration action based on the negative voltage applied to the sample, and collide with a conversion electrode 112. Thus, secondary electrons 111 are generated. The secondary electrons 111 emitted from the conversion electrode 112 are trapped by a detector 113, and an output of the detector 113 is changed depending on the amount of captured secondary electrons. Luminance of a display device (not shown) is changed depending on this output. For example, in a case where a two-dimensional image is formed, an image of a scanning area is formed by synchronizing a deflection signal to the scanning deflector 105 and the output of the detector 113.

The scanning electron microscope illustrated in FIG. 1 includes a deflector (not shown) that moves on a scanning area of the electron beam. This deflector is used for forming an image of patterns which are present in different positions and have the same shape. This deflector is called an image shift deflector, and allows the position of the field of view of the electron microscope to be moved without the movement of the sample using the sample stage. The image shift deflector and the scanning deflector may be used as a common deflector, an image shift signal may be superimposed on a scanning signal, and the superimposed signals may be supplied to the deflector.

Although it has been described in the example of FIG. 1 that the electrons emitted from the sample are converted using the conversion electrode and are detected, the present invention is not limited to such a configuration, and a detection surface of the detector or an electron multiplier may be formed in, for example, an orbit of the accelerated electrons. A blanking deflector (not shown) is provided in an SEM 100. The blanking deflector is a mechanism that blocks the irradiation of a sample with a beam by deflecting the beam outside a beam optical axis.

In the example of FIG. 1, an electrostatic deflector is employed as the scanning deflector 105. The electrostatic deflector can scan at a speed higher than that of an electromagnetic deflector. If high-speed scanning is not requested, the electromagnetic deflector may be used.

A control device 120 controls the respective components of the scanning electron microscope, and has a function of forming an image based on the detected electrons or a function of measuring a pattern width of the pattern formed on the sample based on an intensity distribution of the detected electrons, which is called a line profile. The control device 120 includes an SEM control device that primarily controls an optical condition of the SEM and a signal processing device that performs signal processing of a detection signal acquired by the detector 113. The control device of the SEM includes a scanning control device for controlling a scanning condition (detection, speed, or the like) of the beam. An image processing unit includes an image memory. The image memory is a memory capable of storing 256 intensities of gradations in a depth direction in pixels of 1024×1024. The writing of the signals in the addresses (pixels) is performed based on the signals output from the SEM control device. An address signal corresponding to a memory position of the image memory is synchronized with an irradiation position using the beam, and thus, the irradiation position using the beam matches a write coordinate. A signal read so as to correspond to the address is converted into a digital signal from an analog signal in an AD converter, and becomes a luminance modulation input of an image display device. The control device 120 performs an accumulation process of accumulating image data items acquired based on the scanning performed multiple times. For example, the accumulation process is performed by averaging signals acquired by a plurality of frames for every pixel.

The control device 120 performs the supplying of the signals to the deflector for beam scanning to be described below and an image generation process.

Embodiment 1

As shown in FIG. 2, one frame is imaged by performing scanning of an n-th line and scanning of an (n+1)-th line in an opposite direction to each other in each frame and repeating reciprocating scanning (reciprocating scanning in which the blanking is not performed) in an X direction. In raster scanning, the beam is blocked by performing the blanking (On) after the scanning of the n-th line is ended. The beam is returned onto the sample by canceling the blanking (Off) when the scanning of the (n+1)-th line is started, but unnecessary beam irradiation is performed out of FOV when the On and Off of the blanking are performed. The beam irradiation unnecessary in the signal detection is performed on the sample until the beam reaches a stop (member that blocks the reaching of the beam to the sample) from a scan ending point of the n-th line and until a scan starting point of the (n+1)-th line from the stop. Such unnecessary beam irradiation may lead to the accumulation of electric charge on the sample and may also lead to the attraction of electric charge asymmetric with respect to a center of the FOV.

In the scanning method illustrated in FIG. 2, an irradiation position of the electron beam is moved between an ending point of the n-th line and a starting point of the (n+1)-th line such that the sample is continuously irradiated without interrupting the beam irradiation. In other words, the irradiation position of the beam is moved over different scan lines without performing the blanking. As shown in FIG. 2, in a first frame, the scanning starts from a starting point 201, and the beam scanning is performed up to an ending point 202. In the scanning method illustrated in FIG. 2, the scanning is performed such that the scan line is turned back in order to move the beam irradiation position to a scan starting point of the next scan line from a scan ending point of one scan line while avoiding the unnecessary beam irradiation (without the blanking). More specifically, when the irradiation position of the beam is moved from an ending point of one scan line that extends in the X direction to another scan line that similarly extends in the X direction, the beam irradiation position is moved in a Y direction by one scan line, and the scanning is repeated with the moved beam irradiation position as a scan starting point of the next scan line. Thus, one frame is scanned.

In a second frame, a point 202 which is the scan ending point of the first frame is used as the starting point, and thus, the scanning of the next frame is started without performing blanking between the frames (in a state in which the irradiation within the frame is maintained). After the scanning until the point 201 is completed, the above-described scanning is repeated for a third frame and the sequence frames, and the beam irradiation is completed in blankingless continuous scanning. In this case, since a scan direction rotates by 180° in every frame, the electric charge caused by the beam irradiation is equalized as an average effect. Since the scan directions of each pixel in a k-th frame and a (k+1)-th frame are opposite to each other, line profiles of all edges in a vertical direction are symmetric with respect to the scan directions (in the X direction) as the average effect.

As illustrated in FIG. 2, it is possible to equalize the electric charge by performing the turning-back scanning such as the ending point of one scan line and the starting point of the next scan line are connected to each other and performing the scanning such that the scan starting point and the scan ending point between the frames match each other. Further, since it is not necessary to perform the blanking between scanning processes for the plurality of frames, it is possible to suppress an imbalance of the electric charge caused by excessively accumulating the electric charge within the FOV and irradiating an area out of the FOV with the beam.

Embodiment 2

In the present embodiment, a scanning method of changing an arrangement direction (sub-scan direction) of the scan lines in four frames to four directions is illustrated. After the scanning of the first and second frames is ended as illustrated in Embodiment 1, the scan direction rotates by 90° and the reciprocating scanning is repeated in the Y direction in the blankingless manner in a third frame as illustrated in FIG. 3 or 13. Thus, the scanning is performed until an ending point 303 of the third frame. Dashed arrows of FIG. 13 represent the sub-scan directions of the frames. The scan direction further rotates by 180° by using the scan ending point 303 of the third frame as a scan starting point of a fourth frame, and the reciprocating scanning is repeated. Thereafter, the beam is returned to the starting point 301 of the first frame. In a fifth frame and the subsequent frames, frame accumulation is repeated by repeating the scanning performed from the first frame to the fourth frame, and the beam irradiation is completed in the blankingless continuous scanning. According to the scanning method illustrated in FIG. 3 and the like, since the scan line direction of each pixel is changed to the four directions in the four frames (see, for example, pixel 1301), it is possible to offset the imbalance of the electric charge depending on the scan line direction in each pixel in a vertical direction and a horizontal direction. As stated above, the scanning is performed such that the imbalance of the electric charge depending on the scan line direction is suppressed in each pixel, and thus, it is possible to equalize an electric charge state within the frame.

According to such a scanning method, it is possible to generate the image in a state in which the electric charge state within the frame is equalized, and it is possible to suppress influence caused by the charging. According to the present embodiment, it is possible to equalize an image generation condition in the frame by equalizing the electric charge in each pixel and equalizing the charging between the pixels.

FIG. 14 is a diagram showing a scanning method of sequentially rotating the sub-scan direction by 90° (downward direction, rightward direction, upward direction, and leftward direction). Since there is a difference in electric charge relaxation time by an optical condition of the electron microscope or a material of the sample, an appropriate scanning pattern is preferably selected. Both the examples of FIGS. 13 and 14 are scanning patterns that enable the scan starting point and the scan ending point between the frames to match each other while performing the turning-back scanning, it is possible to equalize the image generation condition within the frame. Particularly, according to the scanning pattern of FIG. 14, it is possible to sequentially rotate the sub-scan direction by 90° without performing the blanking or additional scanning.

Embodiment 3

In a case where the reciprocating scanning is repeated by the methods of Embodiments 1 and 2, the beam position after one frame is scanned is determined depending on a scanning start position and the number of pixels of a scanning area. For example, in a case where the number of pixels in the X direction which is the scan direction and the number of pixels in the Y direction which is the vertical direction thereof are even numbers, the positional relationship between the starting point and the ending point is as illustrated in FIG. 2 after one frame is scanned. As mentioned above, it is considered that the appropriate scanning pattern is changed in some optical conditions of the electron microscope or the material of the sample. Thus, in the present embodiment, in order to increase a variation in the scanning pattern while performing the blankingless scanning, the blankingless reciprocating scanning of one line is further performed out of the field of view (FOV) as shown in FIG. 4. More specifically, the beam scanning for moving the beam irradiation position to the scan starting point of the next frame is performed out of the frame without performing the blanking in addition to the scanning for the frame scanning. As illustrated in FIG. 4, the scan ending point is changed from 402 to 402', and thus, the scan starting point of the next frame is changed from a bottom left corner to a bottom right corner of the frame. The scanning for changing the scan starting point of the next frame is performed in this manner, and thus, it is possible to generate the scanning pattern (the sub-scan direction of the second frame is the leftward direction) which is not able to be implemented by the scanning pattern of FIG. 13 (the sub-scan direction of the second frame is the upward direction) or FIG. 14 (the sub-scan direction of the second frame is the rightward direction). Since the beam scanning is performed along the scanning area without greatly deflecting the beam into an area out of the field of view like the blanking, it is possible to ignore the influence of the electric charge even in the beam scanning performed out of the FOV.

In the second frame, the scan direction rotates by 90°, and the reciprocating scanning is repeated in the Y direction. Subsequently, an area equivalent to one pixel is further widened in the X direction, and the scanning is performed until a point 403'. In the third frame to an eighth frame, the scanning is performed until the eighth frame while sequentially rotating the scan direction by 90°, and the beam is returned to the starting point (point 401) of the first frame as shown in FIG. 4. In a ninth frame and the subsequent frames, the scanning performed for the first to eighth frames is repeated, and the blankingless continuous scanning is performed. In this case, since the scan direction rotates by 90° in every frame, it is difficult for the imbalance in electric charge potential in the X and Y directions to occur and the charging is equalized as the average effect.

Similarly to Embodiment 2, since the scan direction of each pixel is changed to the four directions of the leftward, rightward, upward, and downward directions in the respective frames, all edges of a two-dimensional pattern have equal contrast as the average effect. In Embodiments 2 and 3, an optimal scanning method is selected by a time constant of the electric charge relaxation, and the selected optimal scanning method is applied.

A scanning pattern that changes a scanning trajectory out of the FOV of the scanning pattern of FIG. 4 is considered as a modification example of the scanning pattern illustrated in FIG. 4. For example, although a point 405' is used as the scan ending point of the fourth frame in FIG. 4, the scan direction and the starting point of the fifth frame may be changed by performing the reciprocating scanning for another one line in an area in the FOV. For example, it is possible to position the scan starting point in a top right corner of the frame by additionally performing the scanning of one line, and it is possible to set the scan starting point with this position as its reference. The scanning is performed out of the FOV in this manner, and thus, it is possible to select optimal scanning order and direction depending on an electric charge progress situation of an observation sample. Since the scanning out of the FOV is performed for one pixel, it is possible to increase the variation in the scanning pattern while further minimizing an unnecessary beam irradiation area than the entire area of the FOV (while suppressing the influence of the electric charge). The scanning is performed within the FOV again by using a surrounding area of the typical FOV as a pre-scan area for waiting for stabilization of scan signals and adjusting the scan direction during the pre-scanning process.

FIG. 11 is a diagram for describing the modification example of the scanning pattern illustrated in FIG. 4. In FIG. 11, a scanning pattern using 1103 as a scan ending point of a first frame by using a scan starting point 1102 of a first frame as the starting point within a field of view 1101, repeating the turning-back scanning, and adding one scan line 1104 out of the field of view 1101 is illustrated. According to the scanning pattern, since it is possible to set the scan direction of each pixel in the upward, downward, leftward, and right directions two times and it is also possible to perform the scanning in an area out of the field of view in the upward, downward, leftward, and right directions two times in eight frames, it is possible to equalize the electric charge in the true sense.

FIG. 12 is a diagram illustrating a scanning pattern that enables the scanning for each pixel in four directions in four frames and the scanning an area out of the field of view in the four directions of the upward, downward, leftward, and right directions. In the scanning method of performing the scanning an area within the field of view or an area within the field of view and an area out of the field of view which is illustrated up to now, it is possible to equalize the electric charge in a state in the blanking is not performed by setting the scanning pattern to have the number of frames which is multiples of 4. Thus, for example, it is possible to select the number of frames which is a multiple of 4 and the scanning pattern capable of equalizing the electric charge in an area within the field of view or an area within the field of view and an area out of the field of view by setting multiple types of scanning patterns described above without being aware of an electric charge suppression condition on a graphical user interface (GUI) screen for setting a device condition of the electron microscope.

Embodiment 4

A one-to-one relationship between coordinate data of the scanning of one frame and a coordinate of the image memory is established. For example, in the case of an image of 512×512 pixels, the number of coordinates in one frame is 262144 (=512×512), and a memory in which an image of the one frame is written is also divided into 262144. As stated above, one memory coordinate is assigned to one scan coordinate, and the coordinate updating of a scan signal and the writing of the scan signal in the image memory are synchronously performed. FIG. 5 is a diagram showing the relationship between the scanning position of the beam and the corresponding position of the image memory in which the detection signal acquired through the beam scanning is written. In a case where the scan coordinate in a certain time t is p4, the detection signal acquired in this coordinate is also written in the corresponding image memory coordinate p4 in the same timing. However, the beam irradiation position in the time t is a pixel p3 (pattern C) due to the delay of the scan signal. Information (pattern B) of a scanning pixel p2 reaches the image memory p4 in the time t due to the delay of a secondary electronic signal. An image which is deviated in the field of view in the scan directions is acquired due to the above-described deviation cause. For example, since such deviation is the same direction as the scan direction, the fields of view for X lines adjacent to each other are deviated in the opposite direction to each other in a case where the reciprocating scanning in the X direction is performed.

In a case where the scan direction rotates by 0°, 90°, 180°, and 270° in the respective frames, an image which is deviated in the four directions is acquired for the same pixel information, and blurring of an image after the accumulation occurs. The blur amount (the number of pixels) depends on a scan speed (a scan time per pixel), and the following relational expression is established.

$$\text{Blur amount(number of pixels)} = 2 \times \text{delay time}(Td) / \text{scan time per pixel} \qquad (1)$$

where, Td is the total delay of the scan signal and the secondary electron signal. As can be seen from Expression (1), as the scan speed is high (the scan time per pixel is short), the blur becomes large. Since high-speed scanning is effective as measures of the electric charge, the scanning for performing Embodiments 1 to 3 at a high speed is effective.

In the present embodiment, in order to reduce image blurring caused when the high-speed scanning is performed, an image input timing (hereinafter, referred to as Tm) is adjusted, and is adjusted such that a scan coordinate on the sample and write information for the image memory correspond to each other. A write timing for the memory is delayed by Td, and thus, information of a pattern D is written in p4 of the image memory, and it is possible to correct the deviation in the field of view in the case of the example of FIG. 5 information. The delay time of Expression (1) depends on magnification and other observation conditions, it is necessary to change an image input delay for every observation condition. Thus, when the device is previously adjusted, the relationship between an observation condition and an optimal image input delay is acquired, and a Tm table for every condition is generated. The Tm is stored in a predetermined storage medium, and the control device 120 selects an appropriate Tm depending on the set observation condition and applies the selected Tm when the scanning is performed.

Embodiment 5

In Embodiment 4, the method of adjusting the image input timing Tm in order to reduce the image blurring caused by the deviation in the field of view in every scan direction has been described. As another method, it is considered that the image input timing is fixed and a scan starting timing of each line is adjusted. If a scan starting delay is referred to as Ts, Expression (1) may be changed as follows.

$$\text{Blur amount(number of pixels)} = 2 \times (Td - Ts) / \text{scan time per pixel} \qquad (2)$$

Accordingly, Ts=Td, and thus, it is possible to prevent the image blurring as illustrated in FIG. 6. In a case where Td is different by the observation condition and the scan direction, a Ts table is previously generated for every combination of the observation condition such as magnification and the scan condition, and the control device 120 selects an appropriate Ts depending on the set observation condition and applies the selected Ts when the scanning is performed.

Embodiment 6

In Embodiment 5, the method of adjusting the scan starting time of each line has been described. As another method, a coordinate to be scanned is deviated. For example, in the reciprocating scanning for every line, in a case where the deviation in the field of view of the image on an incoming path with an image in an outgoing path as its reference is ($\Delta X$, $\Delta Y$) in the X and Y directions, a scan coordinate in the incoming path is deviated by ($-\Delta X$, $-\Delta Y$) with a scan coordinate in the outgoing path as its reference. An image is generated without changing an image coordinate when the image is accumulated, and thus, the fields of view in the outgoing path and the incoming path match each other on the image.

Embodiment 7

In the above-described embodiment, the method of adjusting the image input timing and the timing of the scan signal and reducing the image blurring caused by the deviation in the field of view in every scan direction has been described. As a different method, a method of adjusting a position of the field of view through image processing will be described. As shown in FIG. 7, odd-numbered lines and even-numbered lines are scanned in opposite directions to each other in each frame. In the example of FIG. 7, an image of 512×512 pixels is considered. The image is divided into an image (A) of only the odd-numbered lines and an image (B) of only the even-numbered lines, and two images of 512 (X direction)×256 (Y direction) pixels are generated. Deviations in the field of view of the two images are measured, the image B is moved with the image A its reference or the image A is moved against the image B, and both the images are corrected through image processing such that both the images are not deviated. Through such processing, an image of 512×512 pixels is acquired. This procedure is performed in each frame.

Embodiment 8

Another method of reducing the image blurring caused by the deviation in the field of view in every direction through the image processing will be described. As shown in FIG. 8, detection signals acquired based on beam scanning performed on odd-numbered lines of a frame 1 and even-numbered lines of a frame 2 are stored in a first image memory, and an image A (right scan image, see FIG. 15) is generated. Similarly, detection signals acquired based on beam scanning performed on even-numbered lines of the frame 1 and odd-numbered lines of the frame 2 are stored in a second image memory, and an image B (left scan image) is generated. Since the images stored in the first image memory and the second image memory are acquired by the beams of which the scan directions are the same, it is possible to generate an image in which there is no deviation or distortion within the frame. Two-dimensional images are generated in the scan directions in this manner, and a deviation in the field of view between the images is measured. The images are accumulated by moving the image A or B or both these images such that the deviation is corrected, and thus, it is possible to generate the accumulated images having no deviation. For example, a combined image may be generated by performing pattern matching between the images in the direction, correcting the deviation, and accumulating the images.

In a case where there is no beam drift, it is not necessary to perform the matching of the image A and the image B for every frame. For example, the frames are accumulated in the state of the images A and B of FIG. 8. After the frames are accumulated, a final image may be acquired by measuring the deviation in the field of view of the accumulated images A and B and appropriately deviating the positions thereof.

The images are generated in the respective scan directions, and then a process of combining may be performed even in a case where the scan directions are four directions. In this case, for example, the accumulated images may be generated by using the image acquired through the beam scanning in a certain direction as the reference image and the reference image and aligning the positions of three images acquired through the beam scanning in the other three directions by performing the pattern matching. In a case where in-plane distortion depending on the scan direction occurs in the image, positions of corresponding portions between the plurality of images are acquired, signals of the respective corresponding points are moved to an average position (for example, positions corresponding to addition average values of positions of corresponding points $(m_1, n_1)$, $(m_2, n_2)$, $(m_3, n_3)$, and $(m_4, n_4)$ of four images in the X direction and positions thereof in the Y direction, or center position of gravity of a two-dimensional shape formed by the positions), and then the images are accumulated. Thus, it is possible to generate the accumulated images in which there is no deviation.

Embodiment 9

As described in Embodiment 3, four kinds of images are generated by collecting the lines having the same direction in the reciprocating scanning in the four directions (images acquired by scanning frames A, B, C and D of FIG. 9). For example, the deviations in the field of view of the other images from the image A among the four images are measured, and the positions of the field of view are moved such that the deviations thereof are removed. The images A, B, C, and D are combined, and thus, a final image is acquired. The generation of the images A, B, C, and D and the correction of the deviations in the field of view are performed for every four frames. In a case where there is no time variation in the drift or deviation, the images A, B, C, and D are accumulated, and the measurement and correction of the deviations in the field of view are ultimately performed. The latter case is performed at a higher speed than that in the former case.

An adjustment method acquired by combining the adjustment method of Embodiments 5 and 6 and the image processing of Embodiments 7 to 9 may be applied.

Embodiment 10

Although it has been described in Embodiments 6, 7, and 8 that the deviation amount in the field of view is acquired through the pattern matching and the image is reconstructed, a method of using sharpness of the pattern edge as an index different from that in the pattern matching will be described in the present embodiment.

The image is acquired by respectively deviating the images (A, B, C, and D) in the respective scan direction shown in FIG. 9 in the X direction and the Y direction by $(\Delta Xi, \Delta Yi)$ (suffix i means the scan direction) and combining the images, the sharpness (hereinafter, referred to as S) of the pattern edge is evaluated in this image, and is recorded. A graph of FIG. 10 is acquired by drawing a variation in the S while changing $(\Delta Xi, \Delta Yi)$ near an initial value, as a graph. As the image is blurred, the S becomes small, and the S has the maximum value when the blur is the smallest. Thus, a final image for measurement is acquired by acquiring $(\Delta Xio, \Delta Yio)$ in which the S is maximized and combining the images in a state in which the images are moved in the respective directions by $(\Delta Xio, \Delta Yio)$.

Since it is considered that the accumulated images of which sharpness is high are images accumulated after the positions thereof are appropriately aligned, it is also possible to acquire the accumulated images in which there is no deviation between the frames by employing the above-described method.

Embodiment 11

In the present embodiment, an example in which the deviation $(\Delta Xio, \Delta Yio)$ between the images having different scan directions described in Embodiment 10 is previously acquired and the input coordinate of the memory or the scan signal is adjusted such that this deviation is compensated for will be described. For example, in order to perform such processing, $(\Delta Xio, \Delta Yio)$ is acquired by the same sample as a measurement target, and the acquired $(\Delta Xio, \Delta Yio)$ is fed back to a control system. More specifically, in a case where the image is input to the memory when the scanning for imaging is performed, the images are accumulated while deviating the field of view by a previously acquired ($\Delta Xio$, $\Delta Yio$). Alternatively, the scan signal is delayed by a time equivalent to ($\Delta Xio$, $\Delta Yio$) (see FIG. 6). In this case, it is not necessary to perform a process after the image is acquired by performing the scanning and the image input while feeding ($\Delta Xio$, $\Delta Yio$) back in real time, and thus, it is possible to further reduce a measurement time than in a post-processing method. ($\Delta Xio$, $\Delta Yio$) is recently acquired and is fed back, and thus, it is possible to generate the image which is not influenced by the variation in the device state or the difference in the electric charge depending on the sample. The present adjustment function is referred to as an auto sharpness function.

The cases of Embodiments 7 to 10 are the processes after the image is acquired, pattern information is insufficient in an area near the edge of the FOV and this area is not able to be used in the measurement after the process is performed. In a case where the auto sharpness is applied, the entire FOV is preferably used as a measurable area by adjusting the timing of the scan signal or more widely setting the scan area than the FOV.

Embodiment 12

An optimal deviation value ($\Delta Xio$, $\Delta Yio$) in every direction may be measured when the device is adjusted such that the sharpness S is maximized as mentioned in Embodiment 11, and a table may be generated. When the sample is observed, an optimal value is applied from the table depending on the condition, and thus, it is not necessary to perform the measurement before the imaging is performed. Accordingly, it is possible to improve throughput.

Embodiment 13

In a case where the deviation amount in the field of view in every direction is changed due to the electric charge during the imaging, it is considered that a dummy frame is scanned in order to measure the deviation amount. The dummy frame is not typically used in the image for the observation or the measurement. However, for example, after four frames are scanned, dummy scanning is performed, and the deviations in the fields of view are measured by using the image. The measured values are fed back to the control system in a fifth frame and the subsequent frames. The dummy scanning for measuring the deviation is performed for an eighth frame and the subsequent frames again. The number of times the dummy scanning is performed may be optimized depending on the pattern. For example, the dummy scanning is performed for at least two (or four) frames, and thus, it is possible to suppress the asymmetric electric charge. Accordingly, it is possible to return the scan starting point to the initial position.

Embodiment 14

In order to automatically determine a timing when the dummy scanning is performed in Embodiment 13, it is considered that the sharpness (S) of the pattern edge is continuously monitored simultaneously with the scanning of each frame. When the sharpness exceeds a preset threshold, the correction is dynamically performed by acquiring an optimal value of the deviation amount in the dummy scanning of Embodiment 13 and feeding the acquired optimal value back to the control system.

REFERENCE SIGNS LIST

101 Electron source
102 Extracting electrode
103 Electron beam
104 Condenser lens
105 Scanning deflector
106 Objective lens
107 Sample chamber
108 Sample stage
109 Sample
110 Electron
111 Secondary electron
112 Conversion electrode
113 Detector
120 Control device

The invention claimed is:

1. A charged particle beam device comprising:
a scanning deflector that performs scanning with a charged particle beam emitted from a charged particle source;
a detector that detects charged particles acquired based on the scanning with the charged particle beam; and
a control device that controls the scanning deflector,
wherein the control device controls the scanning deflector to
perform a first scan of an area in such a manner that a first scan line is scanned through deflection of the charged particle beam to a first direction, a second scan line is scanned by changing a scan line position through deflection of the charged particle beam such that a scanning trajectory, which connects an ending point of the first scan line and a scan starting point of the second scan line located in parallel with the first scan line, is drawn and the scanning with the charged particle beam toward a second direction opposite to the first direction from the scan starting point of the second scan line is performed, and the changing of the scan line position and the scanning with the charged particle beam toward the opposite direction are repeatedly performed after the second scan line is scanned until the first scan is completed, and
perform a second scan of the area using a scan ending point of the first scan as a scan starting point of the second scan, or perform the second scan of the area after the scan line position is changed such that a scanning trajectory, which connects the scan ending point of the first scan and the scan starting point of the second scan located in a different position is drawn after the first scan is completed.

2. The charged particle beam device according to claim 1, wherein the control device controls the scanning deflector to perform the second scan of the area in such a manner that a first scan line of the second scan is scanned through deflection of the charged particle beam to the first direction from the scan ending point of the first scan, a second scan line of the second scan is scanned by changing a scan line position through deflection of the charged particle beam such that a scanning trajectory which connects an ending point of the first scan line of the second scan and a scan starting point of the second scan line of the second scan located in parallel with the first scan line of the second scan is drawn and the scanning with the charged particle beam toward the second direction from the scan starting point of the second scan line of the second scan is performed, and the changing of the scan line position and the scanning with the charged particle beam toward the opposite direction are repeatedly performed after the second scan line of the second scan is scanned until the second scan is completed.

3. The charged particle beam device according to claim 2, wherein the control device controls the scanning deflector to perform a third scan of the area in such a manner that a first scan line of the third scan is scanned through deflection of the charged particle beam to a third direction perpendicular to the first direction from a scan ending point included in the second scan, a second scan line of the third scan is scanned by changing a scan line position through deflection of the charged particle beam such that a scanning trajectory which connects an ending point of the first scan line of the third scan and a scan starting point of the second scan line of the third scan located in parallel with the first scan line of the third scan is drawn and the scanning with the charged particle beam toward a fourth direction opposite to the third direction from the scan starting point of the second scan line of the third scan is performed, and the changing of the scan line position and the scanning with the charged particle beam toward the opposite direction are repeatedly performed after the second scan line of the third scan is scanned until the third scan is completed.

4. The charged particle beam device according to claim 3, wherein the control device controls the scanning deflector to perform a fourth scan of the area in such a manner that a first scan line of the fourth scan is scanned through deflection of the charged particle beam to the third direction from a scan ending point of the third scan, a second scan line of the fourth scan is scanned by changing a scan line position through deflection of the charged particle beam such that a scanning trajectory which connects an ending point of the first scan line of the fourth scan and a scan starting point of the second scan line of the fourth scan located in parallel with the first scan line of the fourth scan is drawn and the scanning with the charged particle beam toward the fourth direction from the scan starting point of the second scan line of the fourth scan is performed, and the changing of the scan line position and the scanning with the charged particle beam toward the opposite direction are repeatedly performed after the second scan line of the fourth scan is scanned until the fourth scan is completed.

5. The charged particle beam device according to claim 1, wherein the control device controls the scanning deflector to perform the second scan of the area in such a manner that a first scan line of the second scan is scanned through deflection of the charged particle beam to a fourth direction perpendicular to the first direction from the scan ending point included in the first scan, a second scan line of the second scan is scanned by changing a scan line position through deflection of the charged particle beam such that a scanning trajectory which connects an ending point of the first scan line of the second scan and a scan starting point of the second scan line of the second scan located in parallel with the first scan line of the second scan is drawn and the scanning with the charged particle beam toward a third direction opposite to the fourth direction from the scan starting point of the second scan line of the second scan is performed, and the changing of the scan line position and the scanning with the charged particle beam toward the opposite direction are repeatedly performed after the second scan line of the second scan is scanned until the second scan is completed.

6. The charged particle beam device according to claim 5, wherein the control device controls the scanning deflector to perform a third scan of the area in such a manner that a first scan line of the third scan is scanned through deflection of the charged particle beam to the second direction from a scan ending point included in the second scan, a second scan line of the third scan is scanned by changing a scan line position through deflection of the charged particle beam such that a scanning trajectory which connects an ending point of the first scan line of the third scan and a scan starting point of the second scan line of the third scan located in parallel with the first scan line of the third scan is drawn and the scanning with the charged particle beam toward the first direction from the scan starting point of the second scan line of the third scan is performed, and the changing of the scan line position and the scanning of the charged particle beam toward the opposite direction are repeatedly performed after the second scan line of the third scan is scanned until the third scan is completed.

7. The charged particle beam device according to claim 6, wherein the control device controls the scanning deflector to perform a fourth scan of the area in such a manner that a first scan line of the fourth scan is scanned through deflection of the charged particle beam to the third direction from a scan ending point included in the third scan, a second scan line of the fourth scan is scanned by changing a scan line position through deflection of the charged particle beam such that a scanning trajectory which connects an ending point of the first scan line of the fourth scan and a scan starting point of the second scan line of the fourth scan located in parallel with the first scan line of the fourth scan is drawn and the scanning with the charged particle beam toward the fourth direction from the scan starting point of the second scan line of the fourth scan is performed, and the changing of the scan line position and the scanning with the charged particle beam toward the opposite direction are repeatedly performed after the second scan line of the fourth scan is scanned until the fourth scan is completed.

8. The charged particle beam device according to claim 1, wherein the control device controls the scanning deflector to position an irradiation position of the charged particle beam in the scan starting point of the second scan by deflecting the charged particle beam from the scan ending point of the first scan to a space outside of the area, deflecting the charged particle beam along the area, and deflecting the charged particle beam to a position in the area different from the scan ending point of the first scan.

9. The charged particle beam device according to claim 8, wherein the control device controls the scanning deflector to perform the scanning with the charged particle beam in the space outside of the area along four sides of the area.

10. The charged particle beam device according to claim 1, wherein the control device controls the scanning deflector to continuously perform application of the charged particle beam to the scan ending point included in the first scan and application of the charged particle beam to the scan starting point of the second scan as a scan starting point.

11. The charged particle beam device according to claim 1, wherein the control device controls the scanning deflector to scan the area two times or a number of times corresponding to multiples of 4.

12. The charged particle beam device according to claim 1, wherein the control device generates images in different scan line directions, and combines the plurality of images formed in the different scan line directions.

13. The charged particle beam device according to claim 12, wherein the control device combines the images after positions of the plurality of images formed in the different scan line directions are aligned.

14. The charged particle beam device according to claim 13, wherein the control device combines the images after pattern matching is performed on the plurality of images.

15. The charged particle beam device according to claim 13, wherein the control device calculates a change of sharpness acquired when relative positions of the plurality of images which is combining targets are changed.

* * * * *